(12) United States Patent
Mustafa et al.

(10) Patent No.: US 11,408,530 B2
(45) Date of Patent: Aug. 9, 2022

(54) VALVE FOR VARYING FLOW CONDUCTANCE UNDER VACUUM

(71) Applicant: Applied Materials, Inc., Santa Clara, CA (US)

(72) Inventors: Muhannad Mustafa, Milpitas, CA (US); Muhammad M. Rasheed, San Jose, CA (US)

(73) Assignee: APPLIED MATERIALS, INC., Houston, TX (US)

( * ) Notice: Subject to any disclaimer, the term of this patent is extended or adjusted under 35 U.S.C. 154(b) by 0 days.

(21) Appl. No.: 16/985,875

(22) Filed: Aug. 5, 2020

(65) Prior Publication Data
US 2022/0042617 A1   Feb. 10, 2022

(51) Int. Cl.
| | |
|---|---|
| *F16K 31/04* | (2006.01) |
| *F16K 31/53* | (2006.01) |
| *F16K 7/16* | (2006.01) |
| *H01L 21/677* | (2006.01) |
| *H01L 21/67* | (2006.01) |

(52) U.S. Cl.
CPC ............ *F16K 31/047* (2013.01); *F16K 7/16* (2013.01); *F16K 31/53* (2013.01); *H01L 21/67011* (2013.01); *H01L 21/67739* (2013.01)

(58) Field of Classification Search
CPC .......... F16K 31/047; F16K 31/53; F16K 7/16; F16K 3/03; H01L 21/67739; H01L 21/67011
See application file for complete search history.

(56) References Cited

U.S. PATENT DOCUMENTS

| | | | | |
|---|---|---|---|---|
| 2,830,617 A | * | 4/1958 | Brown | G01F 15/00 137/553 |
| 3,709,137 A | | 1/1973 | Starp | |
| 4,017,872 A | | 4/1977 | Iwata et al. | |
| 4,094,492 A | * | 6/1978 | Beeman | F16K 3/03 138/45 |
| 4,936,350 A | * | 6/1990 | Huber | E03F 7/02 137/68.19 |
| 5,806,725 A | | 9/1998 | Bennett | |

(Continued)

FOREIGN PATENT DOCUMENTS

| | | |
|---|---|---|
| EP | 3477165 B1 | 5/2020 |
| JP | 2019002573 A | 1/2019 |
| KR | 101937295 B1 | 1/2019 |

OTHER PUBLICATIONS

International Search Report and Written Opinion dated Oct. 28, 2021 for Application No. PCT/US2021/040668.

*Primary Examiner* — Patrick C Williams (74) *Attorney, Agent, or Firm* — Patterson + Sheridan LLP; B. Todd Patterson (57) ABSTRACT

Embodiments described herein relate to a valve for semiconductor processing. The valve includes a valve body having an inlet conduit and an outlet conduit separated by a diaphragm body. The diaphragm body includes a motor, a transmission link coupled to the motor, a rotatable ring surrounding a fixed plate and separated by a dynamic seal, the rotatable ring coupled to the transmission link, and one or more shutter plates movably coupled to the rotatable ring by a respective pivotable fastener, wherein the fixed plate includes an opening and the one or more shutter plates are movable relative to the opening.

20 Claims, 7 Drawing Sheets

(56) References Cited

U.S. PATENT DOCUMENTS

| | | | |
|---|---|---|---|
| 8,430,140 B2* | 4/2013 | Ognjanovski | B60K 15/0406 |
| | | | 141/350 |
| 9,175,786 B2* | 11/2015 | Luebbers | F16K 3/03 |
| 9,217,389 B1* | 12/2015 | Lee | F02K 1/11 |
| 9,434,249 B2* | 9/2016 | Park | B60K 15/05 |
| 10,739,666 B2 | 8/2020 | Hwang et al. | |
| 2006/0261303 A1* | 11/2006 | Thomas | F16K 3/03 |
| | | | 251/212 |
| 2009/0025416 A1* | 1/2009 | Murakami | F25B 41/20 |
| | | | 62/324.6 |
| 2015/0041695 A1* | 2/2015 | Daniels | F16K 31/53 |
| | | | 251/212 |
| 2015/0060713 A1 | 3/2015 | Luebbers et al. | |
| 2015/0345019 A1 | 12/2015 | Yuan et al. | |
| 2017/0211707 A1* | 7/2017 | Wakayama | F16K 3/03 |
| 2018/0202559 A1* | 7/2018 | Freeman, III | F02M 19/08 |
| 2019/0121219 A1 | 4/2019 | Hwang et al. | |

* cited by examiner

VALVE FOR VARYING FLOW CONDUCTANCE UNDER VACUUM

BACKGROUND

Field

Embodiments of the present disclosure generally relate to methods and apparatus for processing a substrate. More specifically, embodiments described herein relate to a valve device that enables varying flow conductance during processing (i.e., in situ) of substrates.

Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. The need for greater deposition rate and process control regarding layer characteristics rises as does the desire for increased circuit integration.

In some existing chemical vapor deposition (CVD) chambers and/or atomic layer deposition (ALD) chambers, ampoules are utilized to deliver vaporized precursor material to a processing region via a valve body and nozzle for depositing one or more films on a substrate. Controlling precursor flux is utilized to obtain a consistent deposition rate. Precursor flux is sometimes provided by altering the pressure of the ampoule and/or altering temperature of the ampoule. However, altering the pressure and/or temperature of the ampoule leads to higher defect counts and/or particle concerns.

Accordingly, a method and apparatus for controlling pressure of the precursor delivery systems without the drawbacks discussed above is needed.

SUMMARY

Embodiments described herein relate to a valve for semiconductor processing. In one embodiment, the valve includes a valve body having an inlet conduit and an outlet conduit separated by a diaphragm body. The diaphragm body includes a motor, a transmission link coupled to the motor, a fixed plate coupled to a fixed body within the valve body, and one or more shutter plates movably coupled to the transmission link, wherein the fixed plate includes an opening and the one or more shutter plates are movable relative to the opening.

In another embodiment, a valve for a semiconductor processing chamber is disclosed. The valve includes a valve body having an inlet conduit and an outlet conduit separated by a diaphragm body. The diaphragm body includes a motor, a transmission link coupled to the motor, a rotatable ring surrounding a fixed plate and separated by a dynamic seal, the rotatable ring coupled to the transmission link, and one or more shutter plates movably coupled to the rotatable ring by a respective pivotable fastener, wherein the fixed plate includes an opening and the one or more shutter plates are movable relative to the opening.

In another embodiment, a valve for a semiconductor processing chamber is disclosed. The valve includes a valve body having an inlet conduit and an outlet conduit separated by a diaphragm body. The diaphragm body includes a motor, a transmission link coupled to the motor, a rotatable ring surrounding a fixed plate and separated by a dynamic seal, the rotatable ring coupled to the transmission link, and one or more shutter plates movably coupled to the rotatable ring by a respective pivotable fastener, and movably coupled to the rotatable ring by a respective rod, wherein the fixed plate includes an opening and the one or more shutter plates are movable relative to the opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a valve device for controlling flow of precursor gases in a substrate processing chamber. The valve device is capable of dynamic flow control during processing (i.e., in-situ). The valve device includes a flow orifice that can be adjusted during processing such that flow conductance can be varied. The orifice size can be controlled using software by controlling displacement of one or more shutter plates relative to an opening in a plate. The valve device is constructed of materials that resist degradation from precursor gases and can be used in high temperatures (e.g., about 150 degrees Celsius). The valve device may also be operated at extreme negative pressures (e.g., 1 milli Torr, or less)

Figure 1:
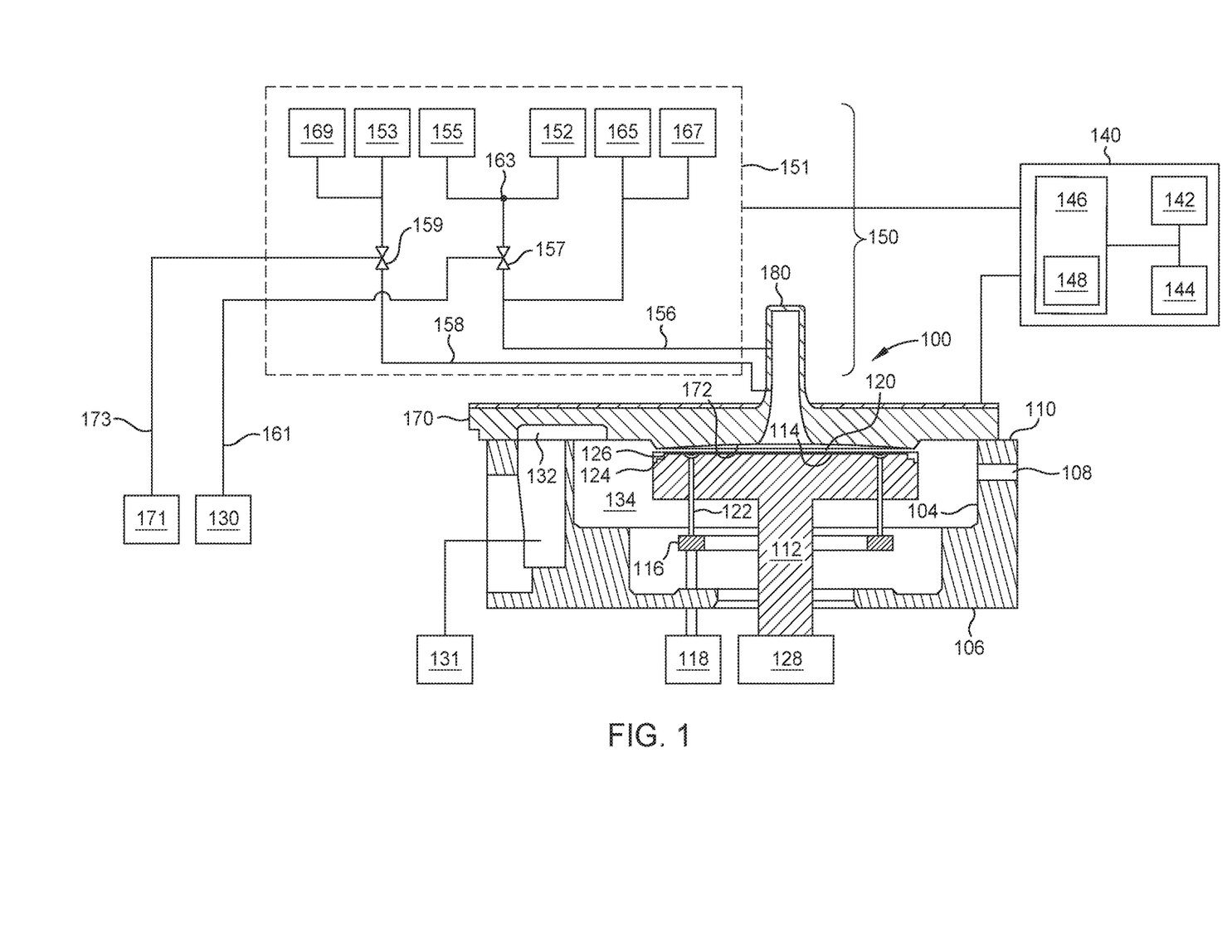
FIG. 1 is a schematic cross-sectional view of an illustrative substrate processing chamber in accordance with embodiments of the present disclosure.

FIG. 1 is a schematic cross-sectional view of an illustrative substrate processing chamber 100 in accordance with embodiments of the present disclosure. The processing chamber 100 may be a schematic depiction of an atomic layer deposition (ALD) chamber, a chemical vapor deposition (CVD) chamber, or other deposition chamber. Embodiments disclosed herein may be utilized with chambers available from Applied Materials, Inc., of Santa Clara, Calif., such as chambers marketed as CENTURA® or ENDURA®, or others. Other substrate processing chambers from other manufacturers may benefit in accordance with the teachings provided herein.

The substrate processing chamber 100 includes a chamber body 106 and a chamber lid 170 disposed on an upper surface 110 of the chamber body 106 to define an inner volume 134. A substrate support 112 supports a substrate 120 on a substrate supporting surface 114. The substrate support (or pedestal) 112 is mounted to a lift motor 128 to raise or lower the substrate support 112 and the substrate 120 disposed thereon. A lift plate 116 coupled to a lift motor 118 is mounted in the processing chamber 100 and raises or lowers pins 122 movably disposed through the substrate support 112. The pins 122 raise or lower the substrate 120 over the surface of the substrate support 112. In some embodiments, the substrate support 112 includes a vacuum chuck, an electrostatic chuck, or a clamp ring for securing the substrate 120 to the substrate support 112. An opening 108 formed in a wall 104 of the chamber body 106 facilitates entry and egress of a substrate into and out of the substrate processing chamber 100.

The substrate support 112 is heated to increase the temperature of the substrate 120 disposed thereon. For example, the substrate support 112 may be heated using an embedded heating element, such as a resistive heater or may be heated using radiant heat, such as heating lamps disposed above the substrate support 112. A purge ring 124 is disposed on the substrate support 112 to define a purge channel 126 which provides a purge gas to a peripheral portion of the substrate 120 to prevent deposition thereon.

An exhaust system 131 is in communication with a pumping channel 132 to evacuate any undesirable gases from the substrate processing chamber 100. The exhaust system 131 also helps in maintaining a desired pressure or a desired pressure range inside the substrate processing chamber 100.

A gas delivery system 150 is coupled to a gas passageway 180 formed in or coupled to the chamber lid 170 to selectively provide precursor gases, reactant gases, carrier gases, purge gases, or combinations of these gases, to the substrate processing chamber 100. The gas delivery system 150 comprises a gas panel 151 having a plurality of gas sources 152, 155, 165, 167 and a plurality of valves (two are shown) 157, 159 coupled to one or more conduits (e.g., conduits 156, 158) to control a flow of gas from the gas panel 151 to the substrate process chamber 100. In some embodiments, the gas panel 151 is configured to combine at least some of the gases provided prior to reaching the valve 157. For example, in some embodiments, the valve 157 may be disposed downstream of a junction 163 coupling gas sources 152, 155 to selectively provide the gases to the substrate processing chamber 100 via the conduit 156 or divert the gases to an exhaust system 130 via a conduit 161. In some embodiments, the valves 157, 159 are switching valves, high speed valves, stop valves, or the like, to facilitate pulsing the gas provided by the gas panel 151. In some embodiments, the valves 157, 159 are two way valves, for example, diverter valves configured to divert the flow of the process gas from the gas panel away from the substrate processing chamber 100 via, for example, conduits 161, 173.

In some embodiments, the conduits 161, 173 are coupled to exhaust systems 130, 171. The exhaust systems 130, 171 may be the same exhaust system or they may be different exhaust systems. Additional gas sources 153 and 169 are coupled to the gas passageway 180 via conduit 158 to provide additional gases to the gas passageway 180. For example, in some embodiments, either or both of the gas sources 153 and 169 may be a precursor gas source to provide a constant flow of a precursor gas for example, such as, titanium tetrachloride ($TiCl_4$) or ammonia ($NH_3$).

In some embodiments, for example, such as where a solid or liquid precursor is utilized, the gas delivery system 150 may also comprise one or more ampoules. In such embodiments, the one or more ampoules may be configured to allow the solid or liquid precursor to be contained and sublime or evaporate into gaseous form for delivery into the substrate processing chamber 100.

In some embodiments, the valves 157, 159 are utilized to vary flow rates and/or volume of precursors from the gas sources 152, 153, 155, 165, 167 and 169 delivered to the processing chamber 100. In some embodiments, pressure of the precursor gases is controlled from the gas sources 152, 153, 155, 165, 167 and 169 using the valves 157, 159 without controlling pressure and/or temperature of the gas sources 152, 153, 155, 165, 167 and 169. The pressure control provided by the valves 157, 159 may be varied during processing (i.e., in situ) such as when the processing chamber 100 is under negative pressures during a deposition process.

A controller 140, such as a programmed personal computer, work station computer, or the like is coupled to the substrate processing chamber 100. Illustratively, the controller 140 comprises a central processing unit (CPU) 142, support circuitry 144, and a memory 146 containing associated control software 148. The controller 140 controls the operating conditions of processes performed in the processing chamber 100, for example, an ALD process or a CVD process. The controller 140 controls operation of the valves 157, 159 as well as other portions of the gas delivery system 150. For example, the controller 140 may be configured to control the flow of various precursor gases and purge gases from the gas delivery system 150 to the substrate processing chamber 100 during different stages of the deposition cycle.

Figure 2:
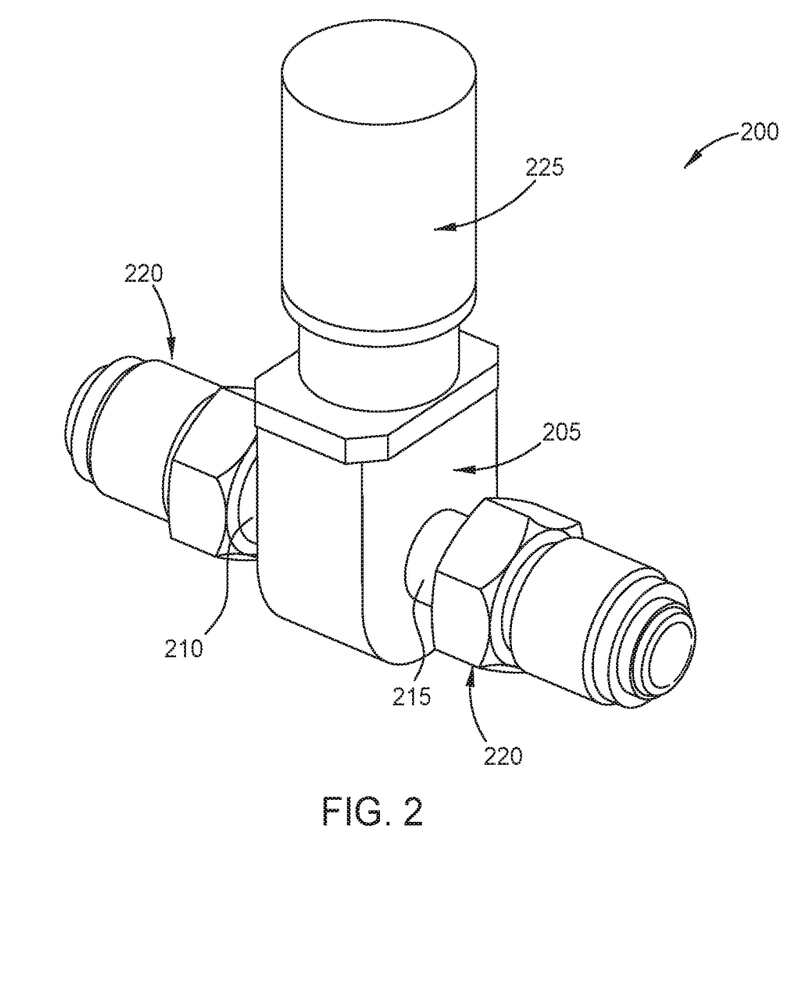
FIG. 2 is an isometric view of one embodiment of a valve device that may be utilized in the substrate processing chamber shown in FIG. 1.

FIG. 2 is an isometric view of one embodiment of a valve device 200. The valve device 200 is utilized as one or both of the valve 157 and valve 159 shown in FIG. 1.

The valve device 200 includes a valve body 205 having an inlet conduit 210 and an outlet conduit 215. Each of the inlet conduit 210 and the outlet conduit 215 include sealing connectors 220, such as metal seal connector or fitting sold under the tradename VCR®. The valve device 200 also includes an actuator housing 225 that includes a motor (shown in FIG. 3A).

Figure 3A:
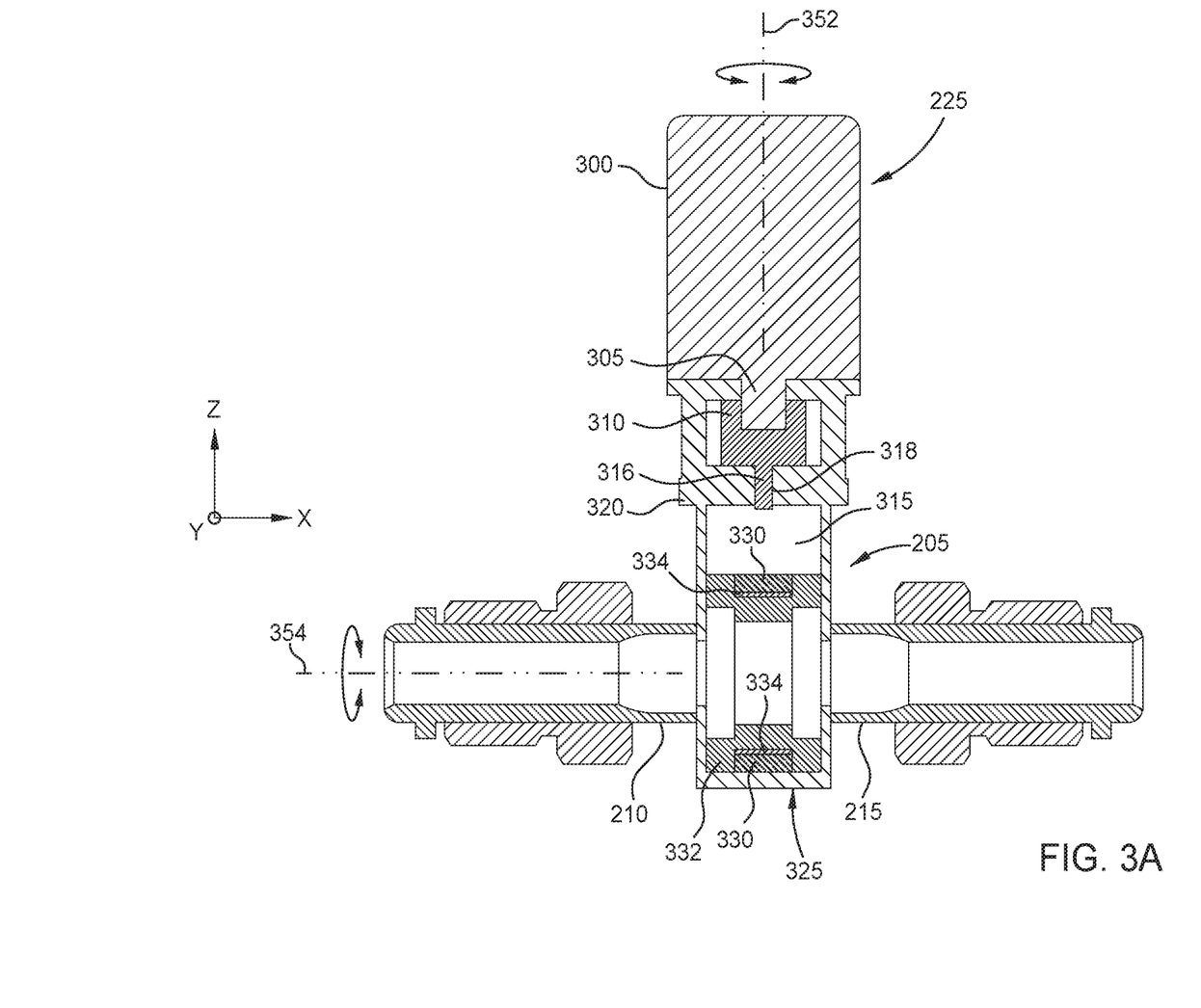
FIG. 3A is a side sectional view of the valve device of FIG. 2.
Figure 3B:
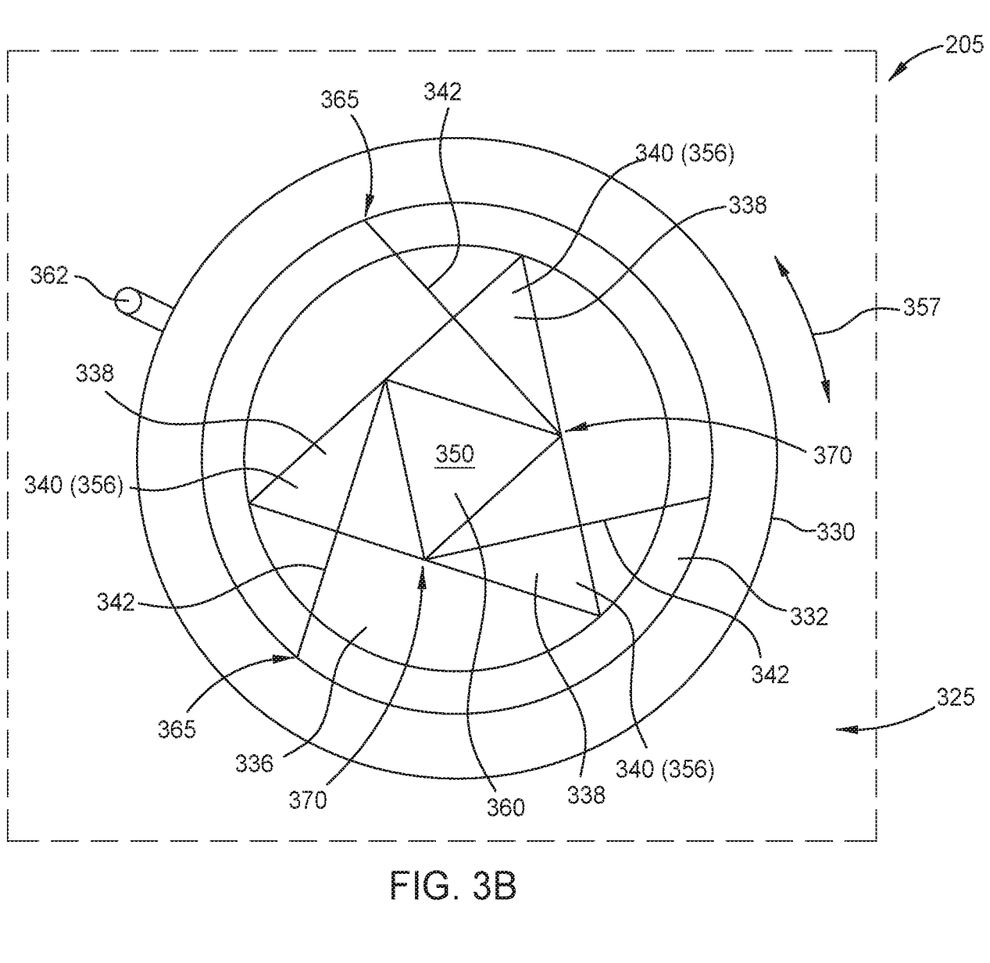
FIG. 3B is a front side view of internal components of the valve device.
Figure 3C:
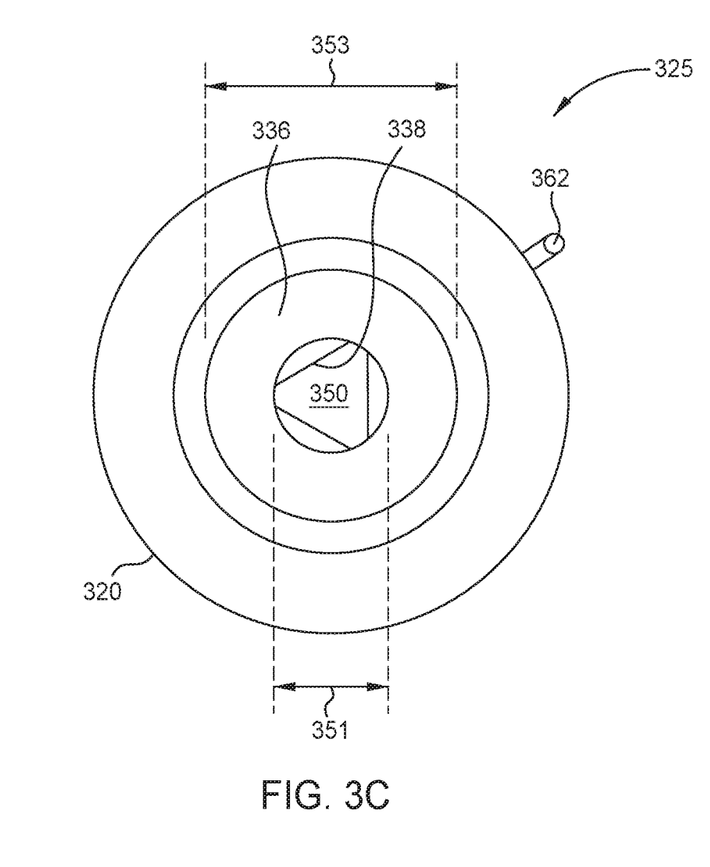
FIG. 3C is a rear side view of internal components of the valve device.

FIGS. 3A-3C are various views of the valve device 200 shown in FIG. 2. FIG. 3A is a side sectional view of the valve device 200. FIGS. 3B and 3C are side views of internal components of the valve body 205. FIG. 3B is a front side view of the internal components and FIG. 3C is a rear side view of the internal components.

Referring to FIG. 3A, the valve device 200 includes a motor 300 that is rotatably coupled to a gear screw 305. The gear screw 305 is rotatably coupled to a linear drive screw 310 which is coupled to a transmission link 315. The linear drive screw 310 may be a lead screw including threads (not shown) such as internal/external threading. The motor 300 is a linear motion stepper motor including an encoder in one embodiment. However, the motor 300 and/or the linear drive screw 310 may be any actuator or actuation device capable of providing controlled movement to the transmission link 315.

The linear drive screw 310 includes an extended member 316 that extends or is disposed through an opening 318 of a plate 320 of the valve body 205. The extended member 326 couples to the transmission link 315 at an end of thereof. Another end of the transmission link 315 is coupled to a diaphragm body 325.

The diaphragm body 325 includes a rotating body or rotatable ring 330 movably coupled to a fixed body 332. The rotatable ring 330 is disposed radially outward of the fixed body 332. The fixed body 332 may at least partially receive a portion of the rotatable ring 330. A dynamic seal 334 is positioned at an interface between the rotatable ring 330 and the fixed body 332. The dynamic seal 334 is a rotary vacuum seal, such as a ferrofluidic seal.

Referring to FIG. 3B, the diaphragm body 325 includes a fixed plate 336 that is part of the fixed body 332. The diaphragm body 325 also includes a plurality of shutter plates 338 rotatably coupled to the fixed plate 336 by pivotable fasteners 340. The diaphragm body 325 also includes a plurality of rods 342. Each rod 342 is movably coupled between both of the rotatable ring 330 and one of the shutter plates 338. As explained in greater detail below, movement of the rotatable ring 330 facilitates movement of each of the shutter plates 338 due to the connection between the rotatable ring 330 and the shutter plates 338 by a respective rod 342. As shown in FIG. 3C, the fixed plate 336 includes an opening 350 having a dimension 351 (e.g., a diameter) that is less than a dimension 353 (e.g., a diameter) of both of the fixed plate 336 and the rotatable ring 330.

In operation, the motor 300 is actuated and the gear screw 305 rotates about a first rotation axis 352 of the valve device 200. Rotation about the first rotation axis 352 causes movement of the linear drive screw 310 in a linear direction (Z direction). Due to the coupling between the linear drive screw 310 and the transmission link 315, linear movement of the linear drive screw 310 causes the rotatable ring 330 to rotate about a second rotation axis 354 of the valve body 205 (the direction 357 shown in FIG. 3B).

When the rotatable ring 330 rotates about the second rotation axis 354, the fixed plate 336 is stationary. However, due to the connection of the plurality of rods 342 to the rotatable ring 330 and the shutter plates 338, the shutter plates 338 rotate about a third rotation axis 356 (shown in FIG. 3B). Depending on the direction of rotation of the rotatable ring 330, the shutter plates 338 are moved relative to the opening 350 of the fixed plate 336. The relative movement of the shutter plates 338 either increases or decreases the size of a fluid flow orifice 360 (i.e., the exposed portion of the opening 350 of the fixed plate 336). Varying the size of the fluid flow orifice 360 facilitates control of the flow of fluids, such as precursor gases, through the valve body 205. The rotatable ring 330 includes a handle member 362 that facilitates a pivotable coupling between the rotatable ring 330 and the transmission link 315.

Referring to FIG. 3B, each of the rods 342 are pivotably coupled to the rotatable ring 330 by a first pivot pin 365. Likewise, each of the rods 342 are pivotably coupled to a respective shutter plate 338 by a second pivot pin 370. As explained above, the rotation of the rotatable ring 330 moves each of the shutter plates 338 to open or close the fluid flow orifice 360.

While three shutter plates 338 are shown above, the diaphragm body 325 is not limited to the number shown.

Figure 4A:
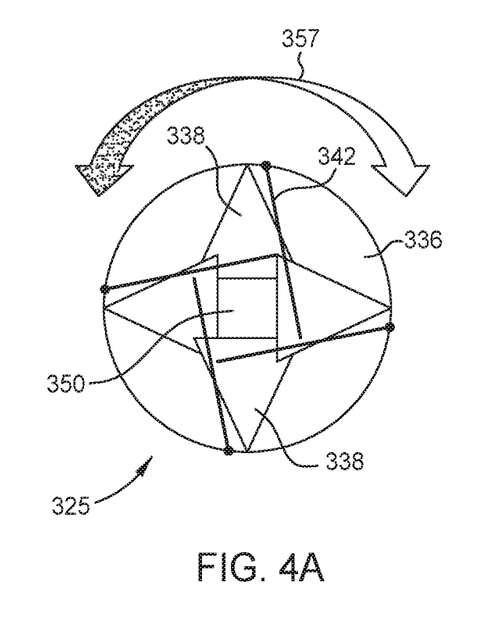
FIGS. 4A and 4B are schematic side views of a diaphragm body of the valve device showing different embodiments of the number of shutter plates.
Figure 4B:
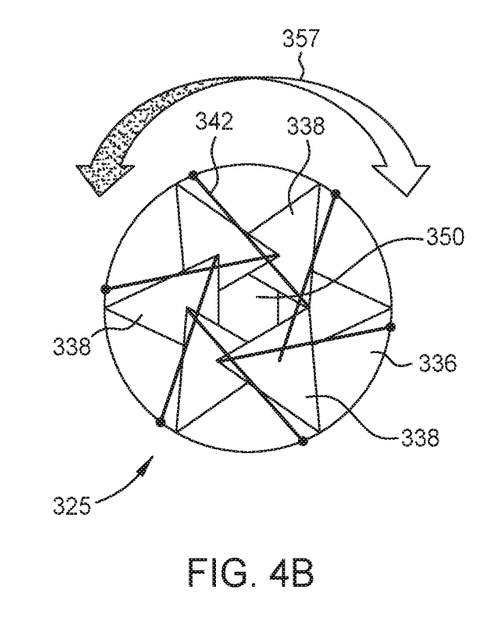

FIGS. 4A and 4B are schematic side views of the diaphragm body 325 showing different embodiments of the number of shutter plates 338. FIG. 4A shows four shutter plates 338 and FIG. 4B shows six shutter plates 338. Each of the shutter plates 338 are coupled to a respective rod 342. When the rotatable ring 330 (shown in FIGS. 3A-3C) moves in the direction 357, the shutter plates 338 open or close about the opening 350. However, the number of shutter plates 338 is not limited to three, four or six, and may include less than three, less than two, or more than four or six.

Alternatively or additionally, the shape of the shutter plates 338 are not limited to triangular as shown above. Similarly, the opening 350 is not shape and/or position as shown above.

Figure 5A:
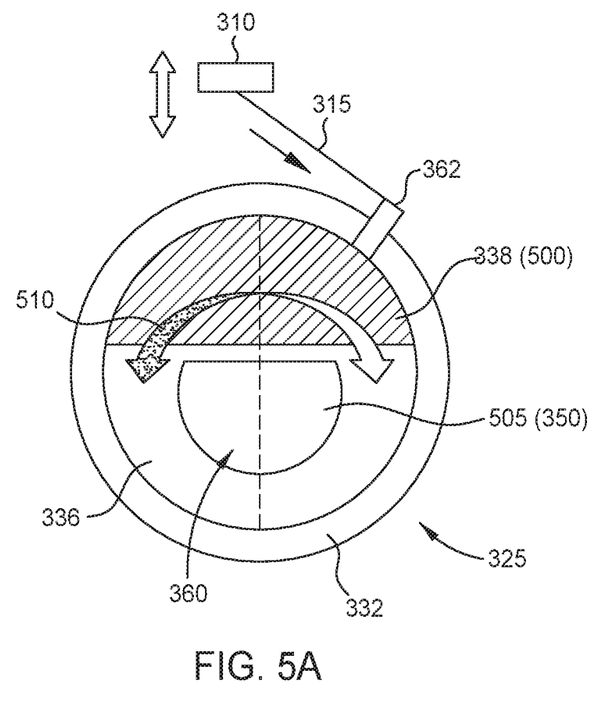
FIGS. 5A and 5B are schematic side views of the diaphragm body showing a single shutter plate according to other embodiments of the valve device.
Figure 5B:
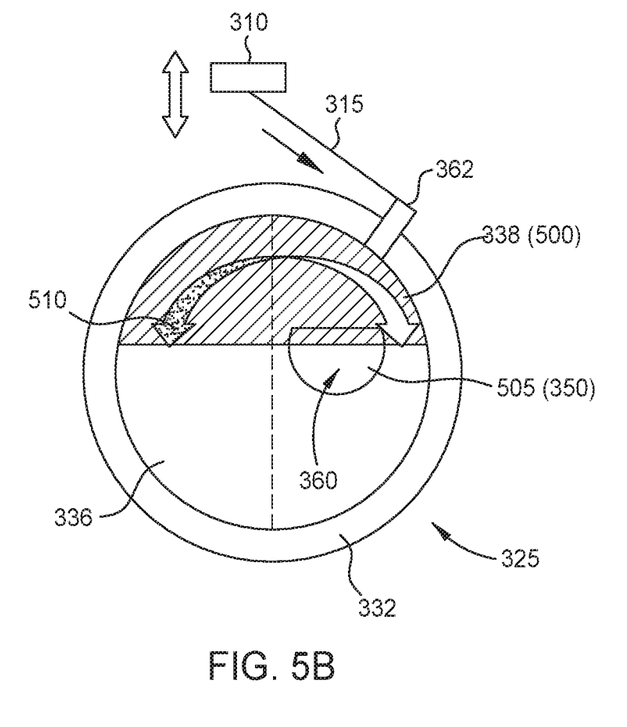

FIGS. 5A and 5B are schematic side views of the diaphragm body 325 showing a single shutter plate 338. The single shutter plate 338 is shown in FIGS. 5A and 5B as a semicircular shutter plate 500. In addition, FIG. 5A shows an opening 505 in the fixed plate 336 shaped as a circle segment in or near a geometric center of the fixed plate 336. Additionally, FIG. 5B shows the opening 505 offset from a center of the fixed plate 336.

In the embodiments shown in FIGS. 5A and 5B, the transmission link 315 is coupled directly to the semicircular shutter plate 500. In these embodiments, movement of the linear drive screw 310 rotates the semicircular shutter plate 500 relative to the fixed plate 336 and/or the opening 505 in a direction 510. This varies the size of the fluid flow orifice 360 thereby controlling the flow of precursors through the opening 505.

The materials of the valve device 200 as described herein, in particular, the diaphragm body 325 of the valve device 200, include metallic materials that are resistant to the precursor materials used in the processing chamber 100. Examples include aluminum, stainless steel, among other process compatible materials. In particular, portions of the diaphragm body 325 and/or the valve body 205 include 400 series stainless steel due to the enhanced corrosion resistance to precursor gases. The metallic materials utilized for the diaphragm body 325 and/or the valve body 205 may also include a coating of another material, such as nickel (Ni).

Embodiments described herein relate to a valve device for controlling flow of precursor gases in a substrate processing chamber. The valve device is capable of dynamic flow control during processing (i.e., in-situ). The valve device as described herein reduces particle generation thereby reducing defects on a processed substrate.

While the foregoing is directed to embodiments of the present disclosure, other and further embodiments of the disclosure may be devised without departing from the basic scope thereof, and the scope thereof is determined by the claims that follow.

What is claimed is:

1. A valve for a semiconductor processing chamber, the valve comprising:
    a valve body having an inlet conduit and an outlet conduit separated by a diaphragm body, wherein the diaphragm body includes:
        a motor;
        a transmission link coupled to the motor;
        a fixed body within the valve body, the fixed body comprising a fixed plate;
        a rotatable ring surrounding the fixed plate;
        a vacuum seal between the fixed plate and the rotatable ring, wherein the vacuum seal is configured to maintain a seal with an outer edge of the fixed body; and
        one or more shutter plates movably coupled to the transmission link, wherein the fixed plate includes an opening and the one or more shutter plates are movable relative to the opening.

2. The valve of claim 1, wherein the motor includes an actuator housing including a gear screw coupled to the motor.

3. The valve of claim 2, wherein the gear screw is coupled to a linear drive screw and the linear drive screw is coupled to the transmission link.

4. The valve of claim 1, wherein the fixed plate and each of the one or more shutter plates comprise a metallic material.

5. The valve of claim 1, wherein each of the one or more shutter plates is coupled to the fixed plate by a pivot pin.

6. The valve of claim 1, wherein each of the one or more shutter plates is shaped as a semicircle.

7. The valve of claim 1, wherein the opening is offset from a center of the fixed plate.

8. A valve for a semiconductor processing chamber, the valve comprising:
   a valve body having an inlet conduit and an outlet conduit separated by a diaphragm body, wherein the diaphragm body includes:
      a motor;
      a transmission link coupled to the motor;
      a rotatable ring surrounding a fixed plate and separated by a dynamic vacuum seal, wherein:
         the dynamic vacuum seal is configured to maintain a seal as the rotatable ring rotates; and
         the rotatable ring is coupled to the transmission link; and
      one or more shutter plates movably coupled to the rotatable ring by a respective pivotable fastener, wherein the fixed plate includes an opening and the one or more shutter plates are movable relative to the opening.

9. The valve of claim 8, wherein the motor includes an actuator housing including a gear screw coupled to the motor.

10. The valve of claim 9, wherein the gear screw is coupled to a linear drive screw and the linear drive screw is coupled to the transmission link.

11. The valve of claim 8, wherein the fixed plate, the respective pivotable fastener, and each of the one or more shutter plates comprise a metallic material.

12. The valve of claim 8, wherein:
   each of the one or more shutter plates is coupled to the fixed plate by a pivot pin; and
   each of the one or more shutter plates is coupled to the rotatable ring by a rod.

13. The valve of claim 12, wherein:
   the rod is coupled to the rotatable ring by a first pivot pin; and
   the rod is coupled to a respective shutter plate by a second pivot pin at an opposing end of the rod.

14. The valve of claim 13, wherein each of the rod, the first pivot pin and the second pivot pin comprise a stainless steel material.

15. The valve of claim 8, wherein the dynamic vacuum seal comprises a ferrofluid.

16. The valve of claim 8, further comprising a linear drive screw coupled to the motor at a first end and coupled to the transmission link at a second end, wherein:
   the motor is configured to move the linear drive screw in a linear direction; and
   the transmission link is configured to transfer linear motion of the linear drive screw to the rotatable ring to rotate the rotatable ring about a rotation axis of the valve body.

17. A valve for a semiconductor processing chamber, the valve comprising:
   a valve body having an inlet conduit and an outlet conduit separated by a diaphragm body, wherein the diaphragm body includes:
      a motor;
      a transmission link coupled to the motor;
      a rotatable ring surrounding a fixed plate and separated by a rotary vacuum seal, wherein:
         the rotary vacuum seal is configured to maintain a seal as the rotatable ring rotates; and
         the rotatable ring is coupled to the transmission link; and
      one or more shutter plates movably coupled to the rotatable ring by a respective pivotable fastener, and movably coupled to the rotatable ring by a respective rod, wherein the fixed plate includes an opening and the one or more shutter plates are movable relative to the opening.

18. The valve of claim 17, wherein the motor includes an actuator housing including a gear screw coupled to the motor.

19. The valve of claim 18, wherein the gear screw is coupled to a linear drive screw and the linear drive screw is coupled to the transmission link.

20. The valve of claim 17, wherein the fixed plate, the respective pivotable fastener, and each of the one or more shutter plates comprise a stainless steel material.

* * * * *